(12) United States Patent
Xie et al.

(10) Patent No.: US 11,239,165 B2
(45) Date of Patent: Feb. 1, 2022

(54) METHOD OF FORMING AN INTERCONNECT STRUCTURE WITH ENHANCED CORNER CONNECTION

(71) Applicant: International Business Machines Corporation, Armonk, NY (US)

(72) Inventors: Ruilong Xie, Niskayuna, NY (US); Christopher J. Waskiewicz, Rexford, NY (US); Kangguo Cheng, Schenectady, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 37 days.

(21) Appl. No.: 16/814,305

(22) Filed: Mar. 10, 2020

(65) Prior Publication Data
US 2021/0287988 A1     Sep. 16, 2021

(51) Int. Cl.
| | |
|---|---|
| *H01L 21/768* | (2006.01) |
| *H01L 21/02* | (2006.01) |
| *H01L 23/535* | (2006.01) |
| *H01L 23/528* | (2006.01) |

(52) U.S. Cl.
CPC ...... *H01L 23/535* (2013.01); *H01L 21/02362* (2013.01); *H01L 21/7685* (2013.01); *H01L 21/76834* (2013.01); *H01L 21/76852* (2013.01); *H01L 21/76865* (2013.01); *H01L 21/76897* (2013.01); *H01L 23/5283* (2013.01)

(58) Field of Classification Search
CPC ........... H01L 21/76849; H01L 21/7685; H01L 21/76852; H01L 21/76865; H01L 21/76829; H01L 21/76834; H01L 21/02362; H01L 23/53223; H01L 23/53238; H01L 23/53252; H01L 23/53266; H01L 23/5283; H01L 21/76897; H01L 21/76816
See application file for complete search history.

(56) References Cited

U.S. PATENT DOCUMENTS

| | | | |
|---|---|---|---|
| 6,680,514 | B1 | 1/2004 | Geffken et al. |
| 6,969,911 | B2 | 11/2005 | Abe |
| 7,514,361 | B2 | 4/2009 | Bonilla et al. |
| 7,666,753 | B2 | 2/2010 | Bonilla et al. |
| 7,745,324 | B1 * | 6/2010 | Yang ............... H01L 21/311 438/618 |
| 7,790,599 | B2 | 9/2010 | Yang et al. |
| 7,830,010 | B2 | 11/2010 | Yang et al. |

(Continued)

FOREIGN PATENT DOCUMENTS

| | | |
|---|---|---|
| CN | 106601664 A | 4/2017 |
| WO | 2010042265 A1 | 4/2010 |

*Primary Examiner* — Younes Boulghassoul
(74) *Attorney, Agent, or Firm* — Cantor Colburn LLP; L. Jeffrey Kelly

(57) ABSTRACT

Interconnect structures and methods for forming the interconnect structures generally include forming a bulk metal encapsulated in first and second interlayer dielectrics, a liner layer about a lower surface of the bulk metal and a metal cap layer about an upper surface of the bulk metal. The liner layer is in the first interlayer dielectric and the metal cap layer is in the second interlayer dielectric, wherein liner layer and the metal cap layer are different metals.

5 Claims, 5 Drawing Sheets

(56) References Cited

U.S. PATENT DOCUMENTS

| | | | |
|---|---|---|---|
| 8,232,200 B1 * | 7/2012 | Oh | H01L 21/76844 |
| | | | 438/643 |
| 9,391,020 B2 | 7/2016 | Zhang et al. | |
| 9,514,981 B1 * | 12/2016 | Badami | H01L 23/53295 |
| 9,831,174 B1 | 11/2017 | Zhang | H01L 21/76856 |
| 10,224,242 B1 * | 3/2019 | Yang | H01L 21/76852 |
| 2003/0175997 A1 | 9/2003 | Kyler et al. | |
| 2003/0175999 A1 | 9/2003 | Kyler et al. | |
| 2005/0087871 A1 | 4/2005 | Abe | |
| 2007/0075428 A1 * | 4/2007 | Wang | H01L 21/76843 |
| | | | 257/751 |
| 2007/0082473 A1 | 4/2007 | Shih et al. | |
| 2007/0264824 A1 * | 11/2007 | Siew | H01L 21/76895 |
| | | | 438/672 |
| 2008/0169565 A1 | 7/2008 | Bonilla et al. | |
| 2008/0254624 A1 | 10/2008 | Yang et al. | |
| 2009/0051033 A1 * | 2/2009 | Gosset | H01L 23/53295 |
| | | | 257/751 |
| 2009/0053890 A1 | 2/2009 | Bonilla et al. | |
| 2009/0250815 A1 * | 10/2009 | Yang | H01L 21/76885 |
| | | | 257/750 |
| 2014/0264864 A1 * | 9/2014 | Weng | H01L 21/76883 |
| | | | 257/751 |
| 2015/0091181 A1 | 4/2015 | Li et al. | |
| 2015/0279784 A1 | 10/2015 | Zhang et al. | |
| 2017/0062275 A1 | 3/2017 | Lenhardt et al. | |
| 2017/0162444 A1 * | 6/2017 | Ok | H01L 21/76852 |
| 2019/0019726 A1 | 1/2019 | Ryan et al. | |
| 2019/0189508 A1 * | 6/2019 | Peethala | H01L 21/76802 |
| 2019/0252208 A1 | 8/2019 | Wallace et al. | |
| 2019/0304918 A1 | 10/2019 | Griggio et al. | |
| 2020/0111699 A1 * | 4/2020 | Peethala | H01L 21/76843 |

* cited by examiner

METHOD OF FORMING AN INTERCONNECT STRUCTURE WITH ENHANCED CORNER CONNECTION

BACKGROUND

The present invention generally relates to semiconductor integrated circuits (ICs) and a method of fabricating the same, and more specifically to structures and methods for forming an interconnect structure with increased surface area connection between a via and an underlying metal line in the case of misalignment between the via and the underlying metal line.

Process flows for fabrication of semiconductor-based ICs can generally be defined as front-end-of-line (HEM), middle-of-line (MOL), and back-end-of-line (BEOL). The FEOL is the first portion of integrated circuit fabrication where the individual devices such as transistors, capacitors, resistors, and the like are patterned in the semiconductor. The MOL generally includes contacts that connect the different devices formed in the FEOL to the interconnects formed in the BEOL, which typically include the formation of contact and plug structures. Interconnect technology (MOL and BEOL) is both increasingly complex and important for sub-14 nm technology nodes, Critical dimensions as well as overlay control become increasingly challenging for these advanced technology nodes.

SUMMARY

Embodiments of the present invention are generally directed to integrated circuits including integrated circuits including interconnect structures and methods for fabricating the same. A non-limiting example of an integrated circuit according to aspects of the invention includes an interconnect structure including a first interlayer dielectric. A second interlayer dielectric is on the first interlayer dielectric. A bulk metal is encapsulated in the first and second interlayer dielectrics. A liner layer is about a lower surface of the bulk metal and a metal cap layer is about an upper surface of the bulk metal. The liner layer is in the first interlayer dielectric and the metal cap layer is in the second interlayer dielectric. The liner layer and the metal cap layer are different metals.

A non-limiting example of an integrated circuit according to aspects of the invention includes an interconnect structure including a liner layer about a lower surface of a bulk metal and a metal cap layer about an upper surface of the bulk metal. The liner layer and the metal cap collectively encapsulate the bulk metal. The liner layer and the metal cap layer are different metals.

A non-limiting example of an integrated circuit according to aspects of the invention includes a method of fabricating an interconnect structure. The method includes forming a metal line or a metal plug in a first interlayer dielectric. The metal line or metal plug includes a conformal liner layer and a bulk metal therein, wherein the interlayer dielectric, the metal line or metal plug have coplanar top surfaces. The first interlayer dielectric is recessed to expose a portion of the liner layer. The exposed portion of the liner layer is selectively removed such that a remaining portion of the liner layer is disposed about a lower surface of the bulk metal. A metal cap is selectively deposited on exposed surfaces of the bulk metal to form the metal cap about an upper surface of the bulk metal. As such, the liner layer and the metal cap collectively encapsulate the bulk metal. The liner layer and the metal cap layer are different metals. An etch stop layer is conformally deposited and a second interlayer dielectric is deposited on the etch stop layer. A self-aligned via is formed in the second interlayer dielectric to the etch stop layer fully aligned or partially aligned to a corner portion of the metal line or the metal plug exposing a portion of the etch stop layer. The exposed portion of the etch stop layer is removed to expose the metal cap at the corner portion and the self-aligned via is metallized.

Additional features and advantages are realized through the techniques of the present invention. Other embodiments and aspects of the invention are described in detail herein and are considered a part of the claimed invention. For a better understanding of the invention with advantages and features, refer to the description and to the drawings.

DETAILED DESCRIPTION

Figure 1:
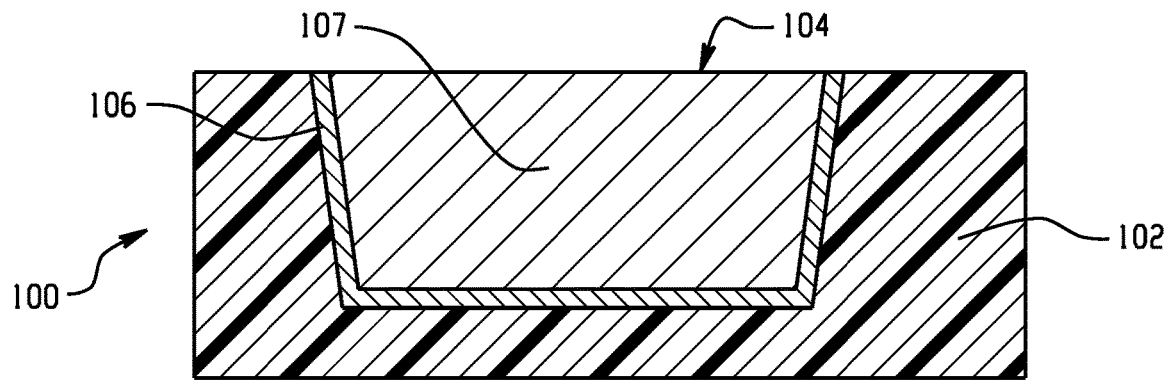
FIG. 1 depicts a cross section of an integrated circuit including a patterned interlayer dielectric including a metal filled line in accordance with one or more embodiments of the present invention.

One of the problems with the formation of interconnects in the BEOL is damage to the liner layer in the metal filled contacts formed during the MOL or REM, processes, resulting in decreased yields.

Embodiments of the present invention overcomes the above noted problems associated with the prior art and provides a robust process for forming the interconnect structure. Embodiments of the invention provide an interconnect structure that eliminates the problems related to the liner layer during hardmask removal according to aspects of the present invention and will now be described herein.

Detailed embodiments of the integrated circuit include an interconnect structure and methods for fabricating the integrated circuit. It is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Turning now to FIG. 1, there is shown an integrated circuit 100 including a patterned first interlayer dielectric 102 including a metal-filled contact structure 104 in accordance with one or more embodiments of the present invention. The metal-filled contact structure is not intended to be limited and can be a gate contact, a metal plug to a top source/drain region, and/or an interconnect to a lower interconnect or MOL contact level. It should also be apparent that the present invention is not limited to contact structures and is applicable to fabrication of metal line features. However, for ease of understanding, reference will be made to contact structures.

The metal-filled contact structure 104 includes a conformal liner layer 106 and a bulk metal 107 and can be fabricated using conventional photolithography, wherein the first interlayer dielectric is patterned to form an opening, e.g. a contact hole or a trench feature. The opening can have a tapered profile, wherein the opening at the bottom diameter has a smaller diameter than the opening at the top. A conformal liner layer 106 is then deposited followed by deposition of the bulk metal 107 to fill the opening and form an overburden thereon. The conformal liner layer 106 can be deposited by either CVD, physical vapor deposition (PVD) or atomic layer deposition (ALM) processes. The overburden can be removed using a planarization process such as a chemical mechanical planarization (CMP) process. The CMP process utilizes a non-selective slurry composition. The slurry composition contains a silica abrasive material, which removes the excess metal. The resulting structure includes a planar top surface, wherein top surfaces of the interlayer dielectric 102, liner layer 106 and bulk metal 107 are coplanar to one another.

The first interlayer dielectric 102 can be composed of a dielectric material having a dielectric constant less than 4.0, which can include any dielectric including inorganic dielectrics or organic dielectrics. In one or more embodiments, the dielectric material is selected to have a dielectric constant less than 3.0. The dielectric material can be porous or non-porous. Some examples of suitable dielectric materials that can be used include, but are not limited to: silicon dioxide ($SiO_2$) deposited by CVD, high density plasma (HDP), or flowable CVD (FCVD); silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric 102 can be deposited by a deposition process such as, for example, chemical vapor deposition (CVD), plasma enhanced chemical vapor deposition (PECVD) or spin-coating as is generally known in the art.

The bulk metal 107 can be formed of an electrically conductive metal or metal alloy. Exemplary metals include, without limitation, tungsten, ruthenium, cobalt, copper and alloys thereof. The bulk metal can be deposited by an electroplating process or the like.

The liner layer 106 can be formed of tantalum (Ta), tantalum nitride (TaN), titanium (Ti), titanium nitride (TiN), ruthenium (Ru), ruthenium nitride (RUN), ruthenium tantalum (RuTa), ruthenium tantalum nitride (RuTaN), tungsten nitride (WN) or any other material that can serve as adhesion layer and/or a barrier to prevent diffusion of the conductive bulk metal. The thickness of the liner layer 106 can vary depending on the deposition process used as well as the material employed. In one or more embodiments, the liner layer 106 can have a thickness from 1 nm to 10 nm; although other thicknesses for the diffusion barrier material are contemplated and can be employed in the present application as long as the liner layer does not entirely fill the opening. The liner layer can be formed by a deposition process including, for example, chemical vapor deposition (CVD), plasma enhanced chemical vapor deposition (PEC D), atomic layer deposition (ALD), physical vapor deposition (PVD), sputtering, chemical solution deposition or plating.

Figure 2:
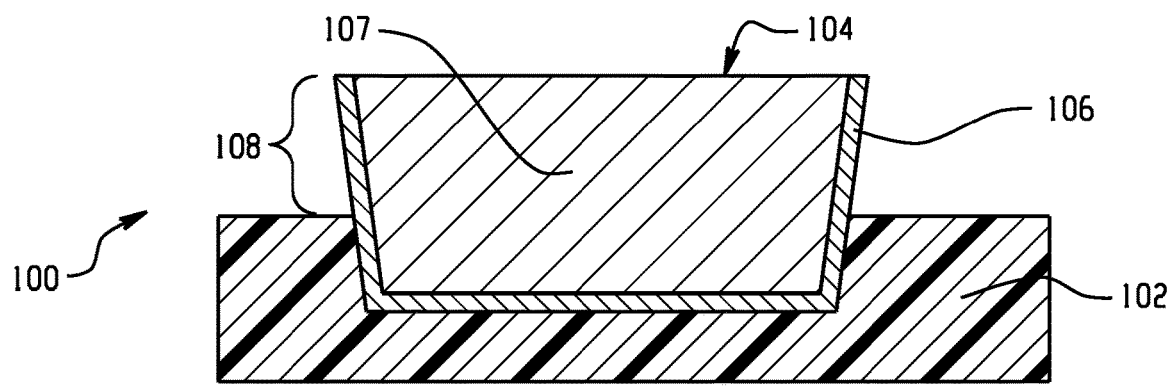
FIG. 2 depicts a cross section of the integrated circuit of FIG. 1 subsequent to selective removal of a portion of the interlayer dielectric in accordance with one or more embodiments of the present invention.

FIG. 2 depicts a cross section of the integrated circuit of FIG. 1 subsequent to selective removal of a portion of the interlayer dielectric 102 in accordance with one or more embodiments of the present invention. The selective removal of the portion of the first interlayer dielectric 102 can be by a wet or a dry etch process. A portion 108 of the liner layer 106 is exposed subsequent to removal of the interlayer dielectric 102. The amount of interlayer dielectric 102 selectively removed is not intended to be limited so long as only a fraction of a vertical length dimension of the liner layer 106 is exposed. The dry or wet etch process can be time-based to remove a desired amount of the interlayer dielectric 102.

Figure 3:
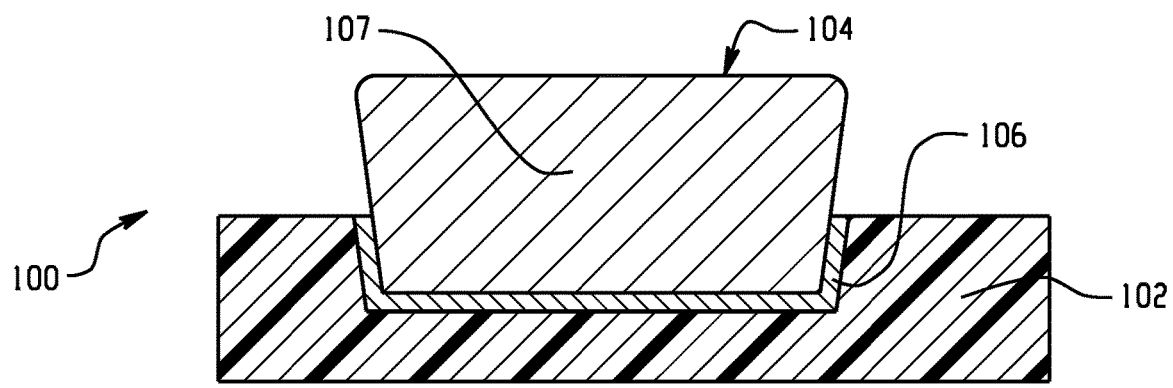
FIG. 3 depicts a cross section of the integrated circuit of FIG. 2 subsequent to selective removal of exposed portions of a liner layer in accordance with one or more embodiments of the present invention.
Figure 6:
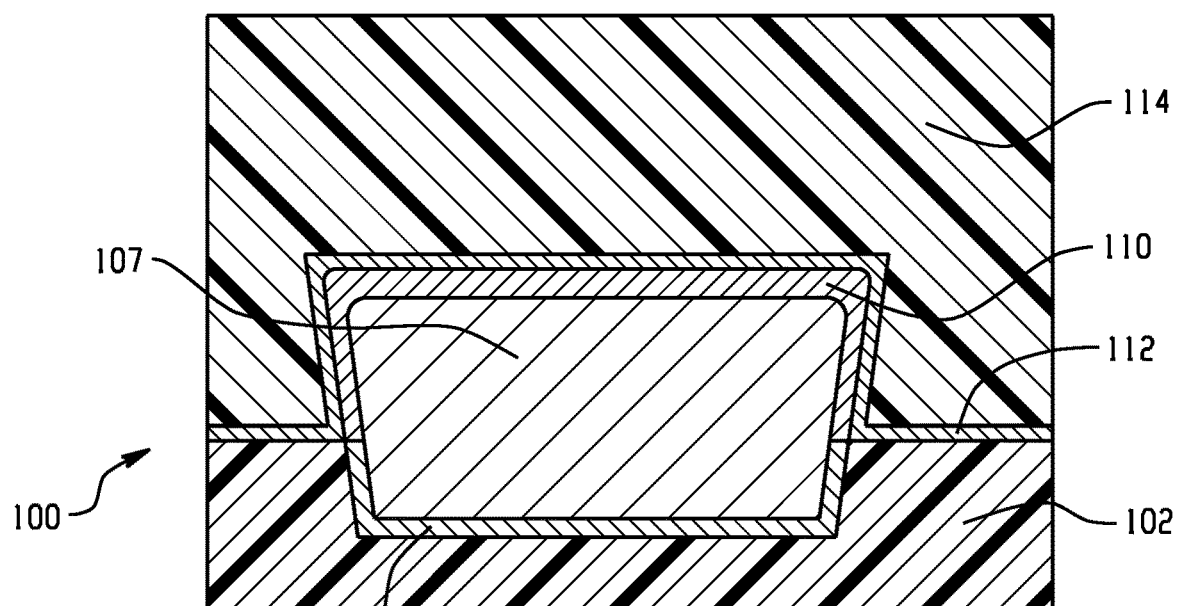
FIG. 6 depicts a cross section of the integrated circuit of FIG. 5 subsequent to deposition of an interlayer dielectric in accordance with one or more embodiments of the present invention.

FIG. 3 depicts a cross section of the integrated circuit of FIG. 6 subsequent to selective removal of the exposed portions 108 (see FIG. 2) of the liner layer 106 such that the liner layer 106 is on a lower surface of the bulk metal 107 in accordance with one or more embodiments of the present invention. The liner layer 106 can be removed using a wet etch process selective to removal of the liner layer. As the selectivity cannot be perfect, the bulk metal 107 can have rounded corners as shown.

Figure 4:
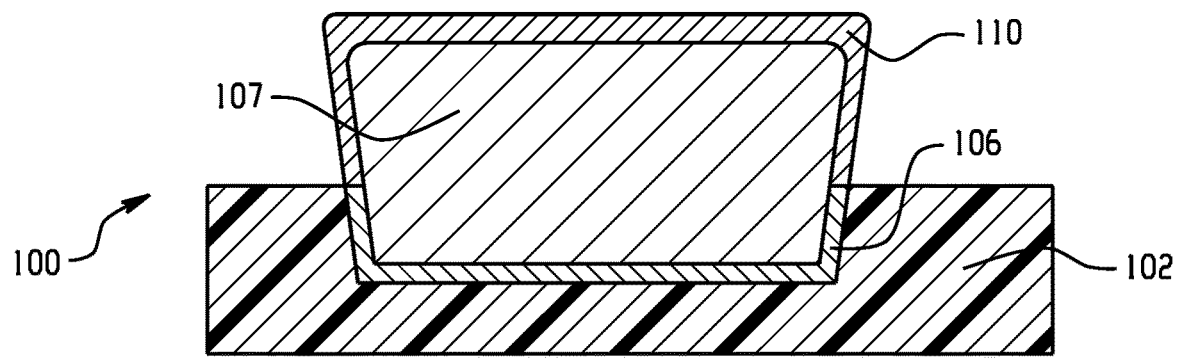
FIG. 4 depicts a cross section of the integrated circuit of FIG. 3 subsequent to conformal deposition of a metal cap layer onto exposed surfaces of the metal filled line in accordance with one or more embodiments of the present invention.

FIG. 4 depicts a cross section of the integrated circuit of FIG. 3 subsequent to selective deposition of a metal cap 110 onto exposed upper surfaces of the bulk metal 107 in accordance with one or more embodiments of the present invention. The thickness of the metal cap 110 as shown approximates the thickness of the liner layer 106, although a greater thickness can be used. Deposition of the metal cap 110 buries the liner layer 106 preventing it from being exposed during subsequent removal of a later formed hardmask layer as will be described in greater detail below. The metal cap 110 is formed of a different metal than the liner layer 106. Exemplary metals include, without limitation, tungsten, ruthenium, cobalt, copper and alloys thereof, which can be the same as or different than the metal utilized in the bulk metal 107. Selective deposition can include an atomic layer deposition process or the like. The combination of the liner layer 106 and the metal cap 110 encapsulate the bulk metal 107.

Figure 5:
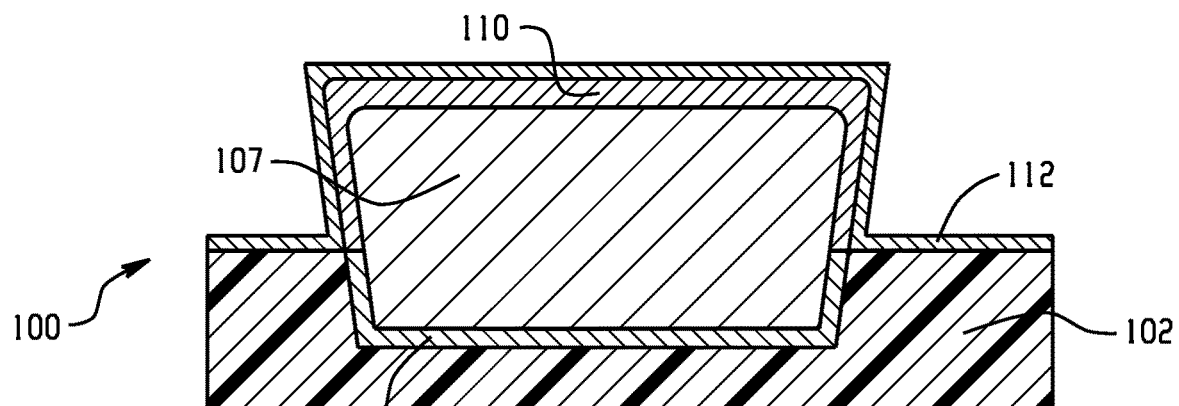
FIG. 5 depicts a cross section of the integrated circuit of FIG. 4 subsequent to conformal deposition of an etch stop layer in accordance with one or more embodiments of the present invention.

FIG. 5 depicts a cross section of the integrated circuit of FIG. 4 subsequent to conformal deposition of an etch stop layer 112 in accordance with one or more embodiments of the present invention. Suitable etch stop layers 112 include, without limitation, aluminum nitride, aluminum oxide, silicon carbide, silicon nitride, or the like.

FIG. 6 depicts a cross section of the integrated circuit of FIG. 5 subsequent to deposition of a second interlayer dielectric 114 onto the etch stop layer 112 in accordance with one or more embodiments of the present invention.

The second interlayer dielectric 114 can be composed of a dielectric material having a dielectric constant less than 4.0, which can include any dielectric including inorganic dielectrics or organic dielectrics. In one or more embodiments, the dielectric material is selected to have a dielectric constant less than 3.0. The dielectric material can be porous or non-porous. Some examples of suitable dielectric materials that can be used include, but are not limited to: silicon dioxide ($SiO_2$) deposited by CVD, high density plasma (HDP), or flowable CVD (FCVD); silsesquioxanes, carbon doped oxides (i.e., organosilicates) that include atoms of Si, C, 0 and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric 102 can be deposited by a suitable deposition process such as, for example, chemical vapor deposition (CVD), plasma enhanced chemical vapor deposition (PECVD) or spin-coating as is generally known in the art.

In one or more embodiments, the second interlayer dielectric 114 can be a single layer or multiple layers and can be different a different material relative to first interlayer dielectric 102. An exemplary multilayer dielectric includes a sacrificial nitride layer overlaying an ultra-low k dielectric material, which is generally defined as a dielectric material having a dielectric constant less than 2.5. As a result, if implemented at MOL, the resulting effective interlayer dielectric can be reduced due to the combination of the first and second dielectric layers 102 and 114. Additionally, it should be readily apparent that the resulting interconnect structure will provide a contact structure formed within two layers of interlayer dielectric.

Figure 7:
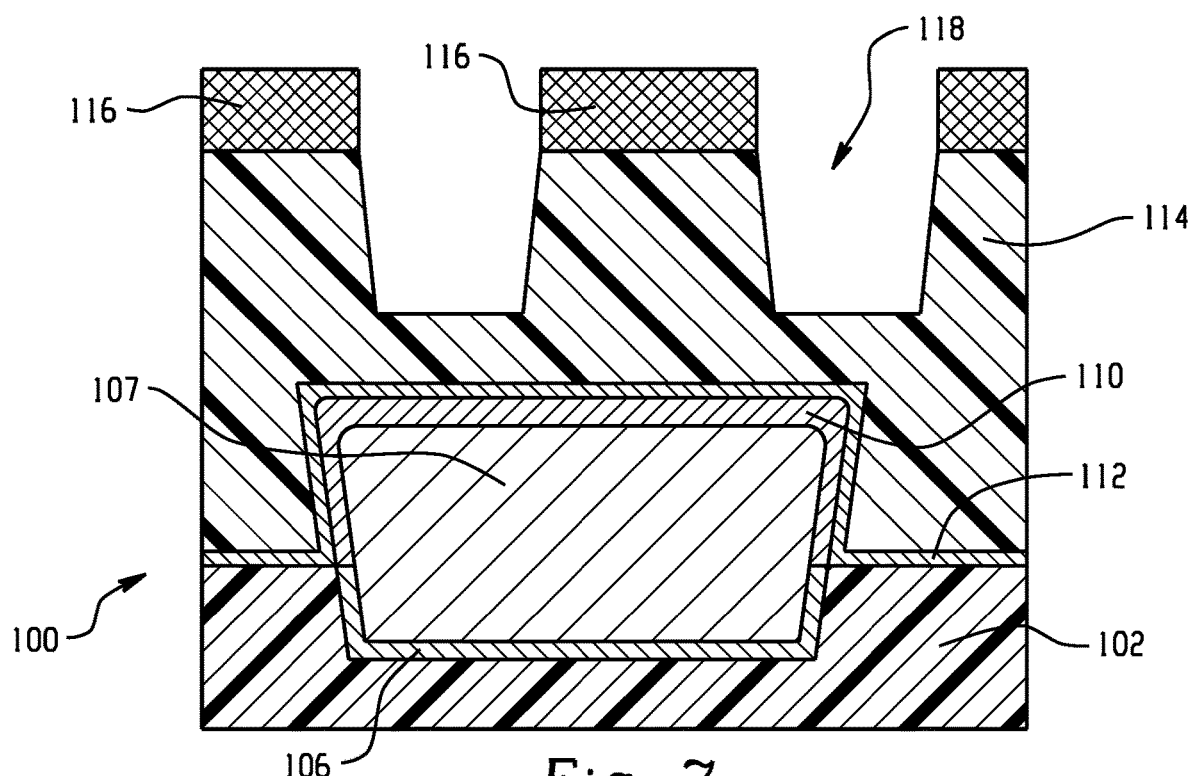
FIG. 7 depicts a cross section of the integrated circuit of FIG. 6 subsequent to deposition of a hardmask layer and patterning thereof to form trench features in the interlayer dielectric in accordance with one or more embodiments of the present invention.

FIG. 7 depicts a cross section of the integrated circuit of FIG. 6 subsequent to deposition of a hardmask layer 116 and lithographic patterning thereof to form trench features 118 in the interlayer dielectric 114 in accordance with one or more embodiments of the present invention. The hardmask layer 116 can be formed of Ta, TaN, Ti, TiN, Ru, RAIN, Ta, RuTaN, W, WN or the like. The hardmask layer 116 can be formed by a deposition process including, for example, chemical vapor deposition (CND), plasma enhanced chemical vapor deposition (PECVD), atomic layer deposition (ALD), physical vapor deposition (MID), sputtering, chemical solution deposition or plating.

Figure 8:
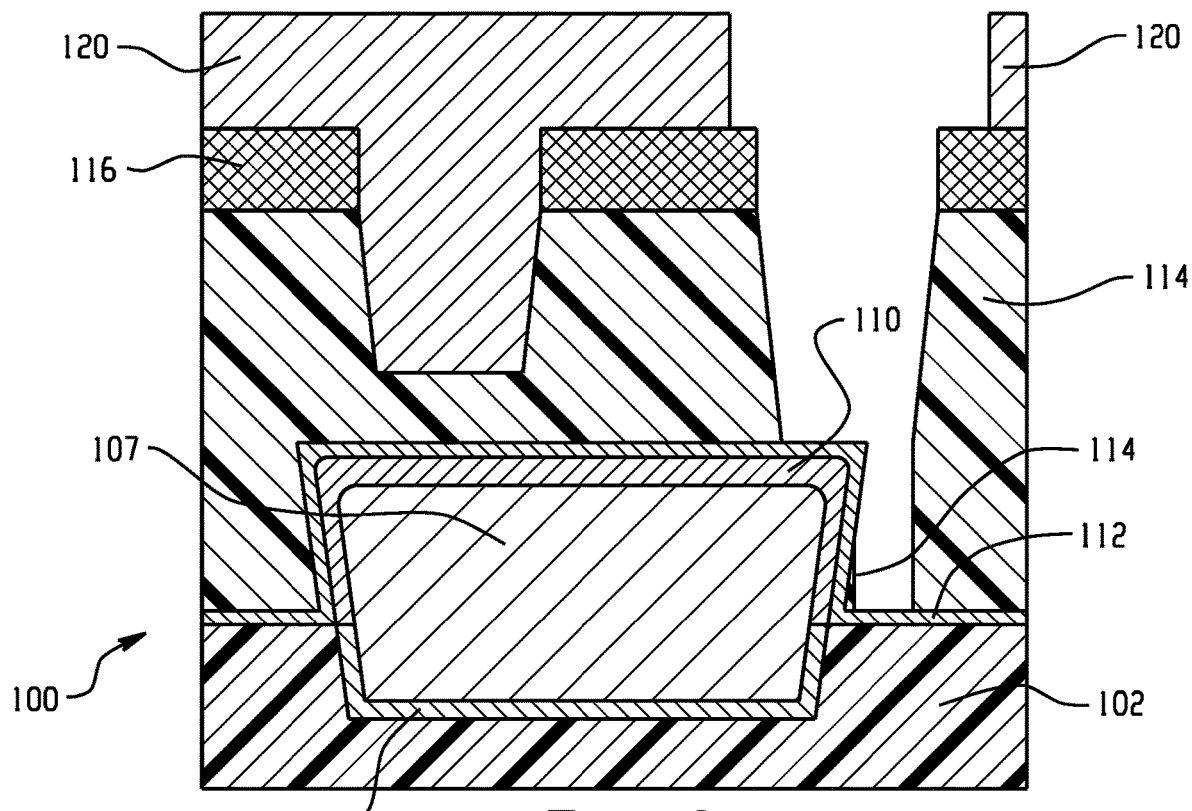
FIG. 8 depicts a cross section of the integrated circuit of FIG. 7 subsequent to deposition of an organic planarizing layer and patterning thereof to form a self-aligned via feature to the etch stop layer in accordance with one or more embodiments of the present invention.

FIG. 8 depicts a cross section of the integrated circuit of FIG. 7 subsequent to deposition of an organic planarizing layer 120 and lithographic patterning thereof to form a self-aligned via feature to the etch stop layer 112 overlying a portion of the metal cap 110 (e.g., a corner of the contact structure) in accordance with one or more embodiments of the present invention. Here, the lithographic step generally includes applying the organic planarizing layer (OPL) 120, silicon anti reflective coating (SiARC) (not shown), and photoresist (not shown) to the surface, exposing the photoresist to a desired pattern of radiation, and developing the exposed photoresist utilizing a conventional resist developer to form a pattern. The etching process can then transfer the pattern into the underlying interlayer dielectric layer 114 to the etch stop layer 112. The etching process can be a dry etching process such as, for example, plasma reactive-ion-etching (RIE), ion beam etching, plasma etching or laser ablation.

Figure 9:
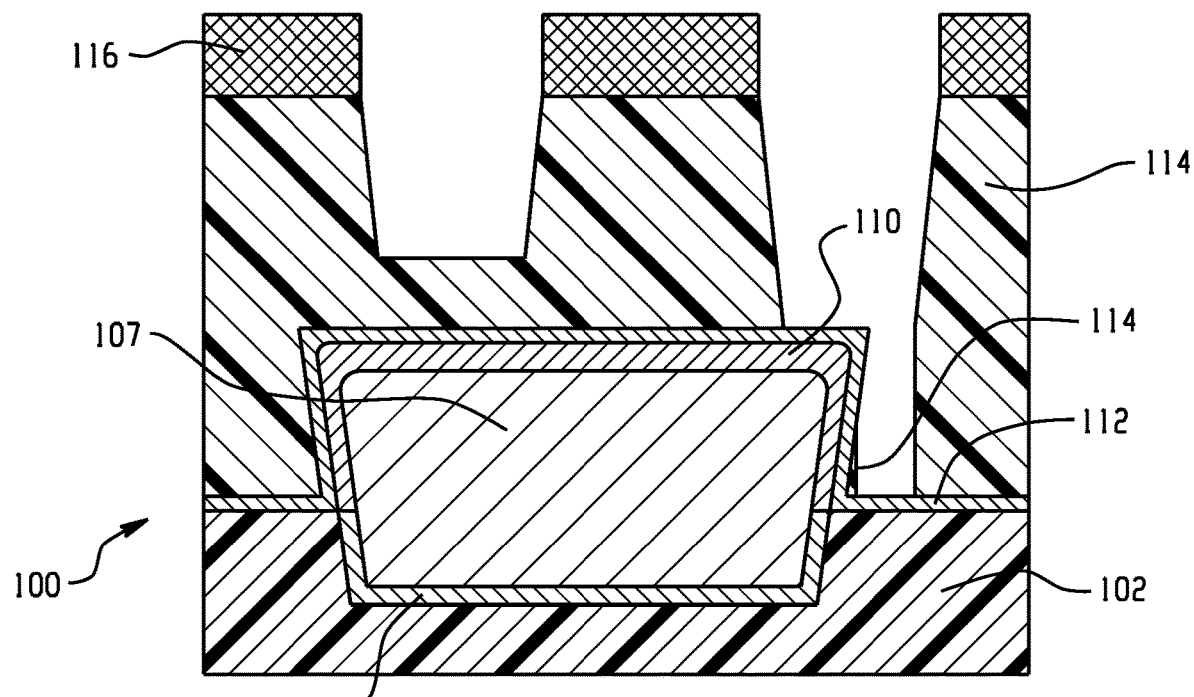
FIG. 9 depicts a cross section of the integrated circuit of FIG. 8 subsequent to removal of the organic planarizing layer in accordance with one or more embodiments of the present invention.

FIG. 9 depicts a cross section of the integrated circuit of FIG. 8 subsequent to removal of the organic planarizing layer 120, SiARC, and photoresist in accordance with one or more embodiments of the present invention.

Figure 10:
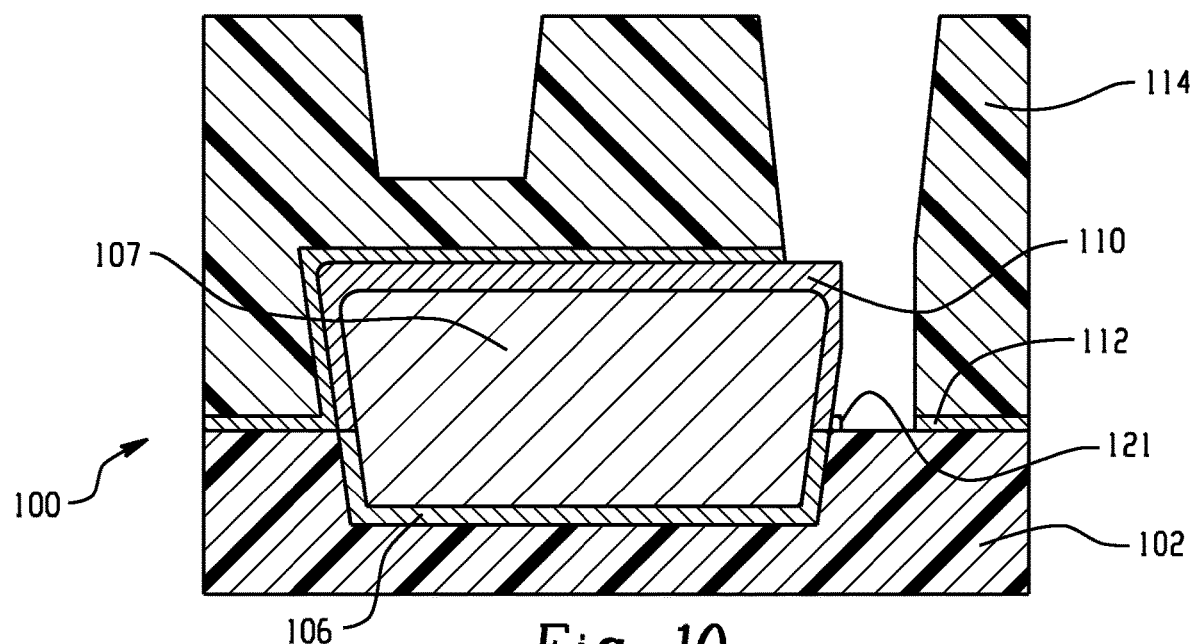
FIG. 10 depicts a cross section of the integrated circuit of FIG. 9 subsequent to selective removal of exposed portions of the etch stop layer in accordance with one or more embodiments of the present invention.

FIG. 10 depicts a cross section of the integrated circuit of FIG. 9 subsequent to selective removal of the hardmask 116 and the exposed portions of the etch stop layer 112 in accordance with one or more embodiments of the present invention. By way of example, a wet etch process selective to the hardmask 116 can be used to remove the hardmask 116 followed by a post RIE cleaning process to selectively remove the etch stop liner. In one or more embodiments, the contact structure is tapered as shown such that subsequent to the directional etch a portion 121 of the etch stop liner 112 on the interlayer dielectric 102 is not removed in its entirety due to a RIE shadowing effect.

Figure 11:
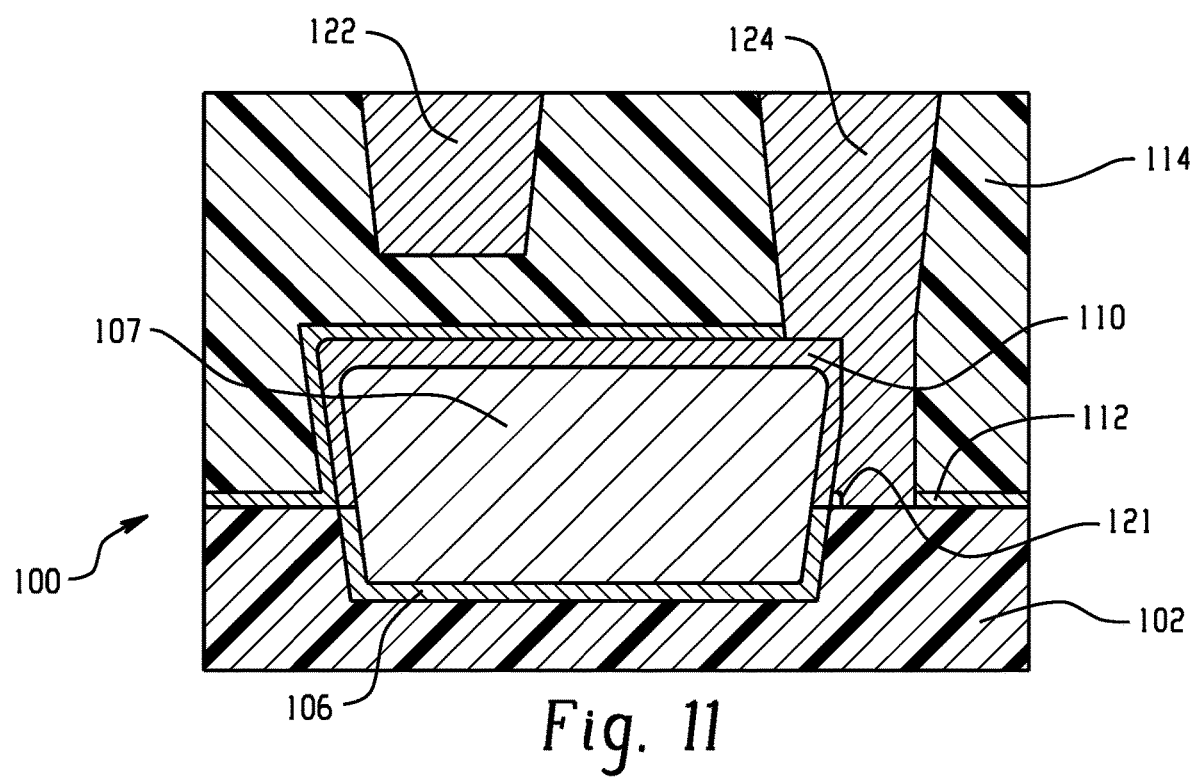
FIG. 11 depicts a cross section of the integrated circuit of FIG. 10 subsequent to metallization of the trench and self-aligned via features in accordance with one or more embodiments of the present invention.

FIG. 11 depicts a cross section of the integrated circuit of FIG. 12 subsequent to metallization to form the interconnects including conductive lines 122 and vias 124, i.e., deposition of a conductive metal in the trench and trench/self-aligned via features in accordance with one or more embodiments of the present invention as shown. As shown, the present invention protects the liner layer 106 and the bulk metal 107 during processing. Advantageously, the process of fabricating the interconnect structure improves the connection between the via and the underlying metal line even in embodiments where the via is not fully aligned with the metal line, e.g., partially contacts the metal line landing on a corner thereof. The recessed portion of the interlayer dielectric to the etch stop layer allows the via to extend thereto and not stop on the metal layer maximizing surface area of the connection between the via and the metal line. The resulting via connection, even in embodiments where there is misalignment, results in reduced resistance.

The descriptions of the various embodiments of the present invention have been presented for purposes of illustration but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A method of forming an interconnect structure, the method comprising:

forming a metal line or a metal plug in a first interlayer dielectric, wherein the metal line or metal plug comprises a conformal liner layer and a bulk metal therein, wherein the interlayer dielectric, the metal line or metal plug have coplanar top surfaces;

recessing the first interlayer dielectric to expose a portion of the liner layer;

selectively removing the exposed portion of the liner layer such that a remaining portion of the liner layer is disposed about a lower surface of the bulk metal;

selectively depositing a metal cap on exposed surfaces of the bulk metal to form the metal cap about an upper surface of the bulk metal, wherein the liner layer and the metal cap collectively encapsulate the bulk metal, and wherein the liner layer and the metal cap layer are different metals;

conformally depositing an etch stop layer, wherein a portion of the etch stop layer abuts the metal cap and is on the first interlayer dielectric;

depositing a second interlayer dielectric on the etch stop layer;

forming a self-aligned via to the etch stop layer fully aligned or partially aligned to a corner portion of the metal line or the metal plug exposing a portion of the etch stop layer;

removing the exposed portion of the etch stop layer to expose the metal cap at the corner portion; and metallizing the self-aligned via.

2. The method of claim 1, wherein forming the self-aligned via comprises a directional etch process.

3. The method of claim 1, wherein the metal line or the metal plug has a tapered profile such that a bottom portion has a smaller width than a top portion.

4. The method of claim 1, wherein the etch stop layer comprises a dielectric material.

5. The method of claim 4, wherein the liner layer comprises tantalum, tantalum nitride, titanium, titanium nitride, ruthenium, ruthenium nitride, ruthenium tantalum, ruthenium tantalum nitride, or tungsten nitride and the metal cap comprises ruthenium, cobalt, copper or alloys thereof.

* * * * *